United States Patent
Zhou et al.

(10) Patent No.: US 8,451,567 B2
(45) Date of Patent: May 28, 2013

(54) HIGH RESOLUTION MAGNETIC READ HEAD USING TOP EXCHANGE BIASING AND/OR LATERAL HAND BIASING OF THE FREE LAYER

(75) Inventors: Yuchen Zhou, San Jose, CA (US); Wenyu Chen, Newark, CA (US); Joe Smyth, Aptos, CA (US)

(73) Assignee: Headway Technologies, Inc., Milpitas, CA (US)

( * ) Notice: Subject to any disclaimer, the term of this patent is extended or adjusted under 35 U.S.C. 154(b) by 269 days.

(21) Appl. No.: 12/928,473

(22) Filed: Dec. 13, 2010

(65) Prior Publication Data

US 2012/0147504 A1    Jun. 14, 2012

(51) Int. Cl.
  *G11B 5/39*    (2006.01)
(52) U.S. Cl.
  USPC ............. 360/324.12; 29/603.14; 29/603.16
(58) Field of Classification Search
  USPC ............. 360/324.1, 324.11, 324.12, 324.2
  See application file for complete search history.

(56) References Cited

U.S. PATENT DOCUMENTS

| | | | |
|---|---|---|---|
| 6,809,900 | B2 | 10/2004 | Covington |
| 7,016,160 | B2 | 3/2006 | Mao et al. |
| 7,106,561 | B2 | 9/2006 | Carey et al. |
| 7,283,337 | B2 | 10/2007 | Sakai et al. |
| 7,572,645 | B2 | 8/2009 | Sun et al. |
| 7,580,229 | B2 | 8/2009 | Carey et al. |
| 2001/0012188 | A1* | 8/2001 | Hasegawa et al. ....... 360/324.12 |
| 2002/0012812 | A1* | 1/2002 | Hasegawa et al. ............ 428/692 |
| 2003/0174446 | A1* | 9/2003 | Hasegawa .................... 360/319 |

* cited by examiner

*Primary Examiner* — Jefferson Evans
(74) *Attorney, Agent, or Firm* — Saile Ackerman LLC; Stephen B. Ackerman

(57) ABSTRACT

A CPP (Current Perpendicular to Plane) MR (Magnetoresistive) read head and its method of fabrication includes a patterned CPP MR sensor stack having a SAF (Synthetic Antiferromagnetic) free layer structure that is longitudinally biased by the combination of an exchange biasing layer formed over the sensor stack and hard biasing layers that are formed adjacent to the patterned sides of the stack. The combination provides the stack with high resolution reading capabilities without the necessity for a narrow read gap formed by closely spaced top and bottom shields. Sixteen embodiments are described that provide different versions of the exchange biasing layer, different positions of the hard biasing layers and different patternings of the CPP MR sensor stack.

32 Claims, 7 Drawing Sheets

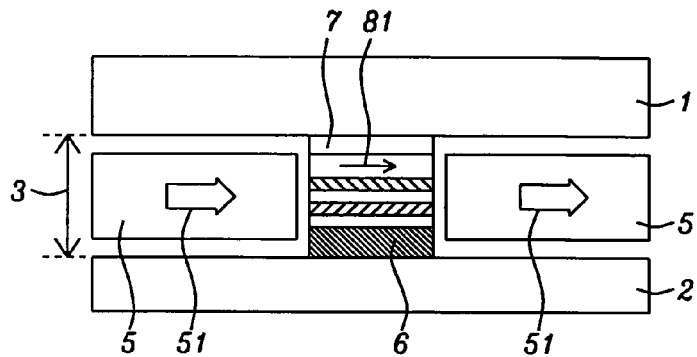
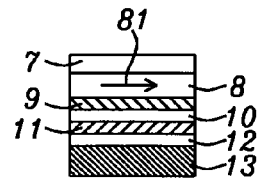
FIG. 1A – Prior Art
FIG. 1B – Prior Art
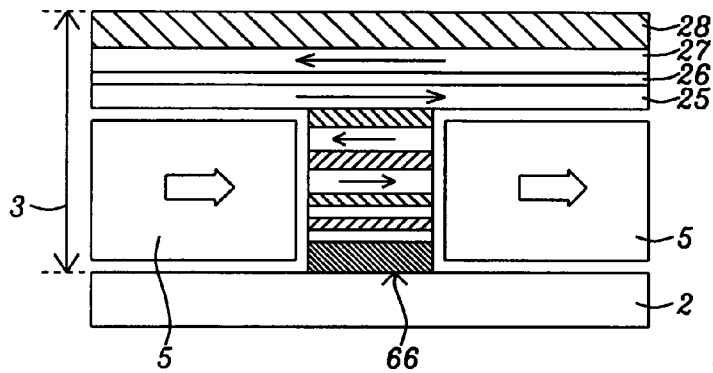
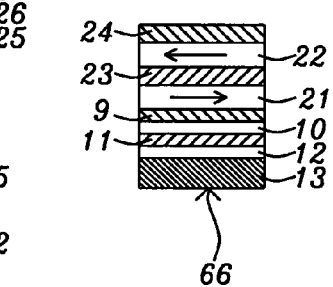
FIG. 2A
FIG. 2B
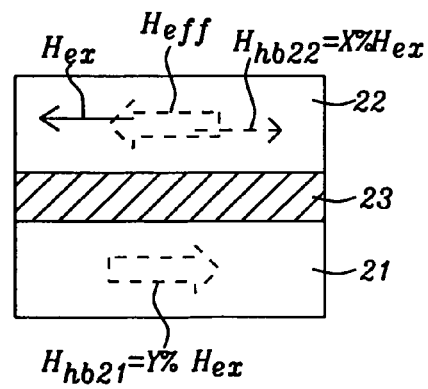
FIG. 3

HIGH RESOLUTION MAGNETIC READ HEAD USING TOP EXCHANGE BIASING AND/OR LATERAL HAND BIASING OF THE FREE LAYER

BACKGROUND OF THE INVENTION

1. Field of the Invention

This invention relates generally to the fabrication of a MR sensor, which can be a tunneling magnetoresistive (TMR) sensor or a giant magnetoresistive (GMR) sensor. In particular it relates to an MR sensor in which resolution is increased by use of a synthetic antiferromagnetic (SAF) free layer structure.

2. Description of the Related Art

With the ever increasing areal density with which data is stored on magnetic media such as disks in hard disk drives (HDD), the magnetoresistive (MR) sensor that is used as the read-back element in the HDD is required to have a correspondingly improved spatial resolution while achieving and maintaining a reasonable signal-to-noise ratio (SNR). Referring to schematic FIGS. 1a, and 1b, there are shown two views of a generic, prior-art current-perpendicular-to-plane (CPP) tunneling magnetoresistive (TMR) read head.

FIG. 1(A) illustrates the read head in a vertical cross-sectional plane parallel to its air bearing surface (ABS) plane. FIG. 1(B) is a portion of the illustration of FIG. 1(A), isolating the sensor stack portion of the head.

Referring to FIG. 1(A), there is shown the ABS cross-sectional view of the CPP TMR (current perpendicular-to-plane tunneling magnetoresistive) head, in which there is a current that passes perpendicularly to the active magnetic layers through the entire head structure and in which the resistance of the head varies in accord with the physical principles of the tunneling-magnetoresistive effect which is based on the tunneling of conduction electrons through a thin dielectric layer. It is to be noted, however, that the head illustrated could equally well be a giant magnetoresistive (GMR) sensor, which would differ structurally from the TMR sensor in that the thin dielectric layer of the TMR structure would be replaced by a thin conducting layer.

Looking vertically downward, there is first shown an upper (or top) shield (1) that protects the sensor stack (6) from extraneous magnetic fields. At the bottom of the head, there is shown a corresponding lower (or bottom) shield (2) that performs a similar task at the bottom edge of the sensor. Thus the sensor is protected by a pair of shields at some desired separation (3), called the read gap (RG).

Hard bias (HB) magnets (5) (magnets formed of hard, i.e. high coercivity, magnetic material) are laterally disposed to either side of the sensor stack (6). These magnets, which stabilize the magnetization (arrow, 81) of the free layer (8) by a magnetostatic interaction with the free layer, are positioned between the shields (1), (2) and their magnetizations are shown as arrows (51). The sensor stack itself (6) is typically formed as a patterned vertical lamination of horizontal layers, formed beneath an upper capping layer (7).

Referring to FIG. 1(B), there is shown a schematic illustration of the isolated patterned sensor stack (6) of FIG. 1a showing the following vertically stacked horizontal layers patterned to a common longitudinal width: a non-magnetic capping layer (7), the magnetically free layer (8), typically a layer of a NiFe compound, showing its magnetization vector as an arrow (81) that is directed longitudinally (i.e., in a cross-track direction relative to a read operation on a magnetic media); a non-magnetic layer (9) that is a dielectric layer (such as MgO) that serves as a tunneling barrier layer for the TMR sensor (or a conducting layer, such as Cu, for a GMR sensor), a reference layer (10), a coupling layer (eg. a layer of Ru) (11) and a pinned layer (12), coupled to layer (10) across coupling layer (11). The magnetization of layer (12) is held spatially fixed by a thick layer (13) of antiferromagnetic material that pins layer (12). The tri-layer (10), (11) and (12) is referred to as a synthetic-antiferromagnetic (SAF) structure, because even though it is formed of ferromagnetic materials, it has the overall behavior of an antiferromagnetic substance.

The symmetrically, horizontally disposed hard biasing layers (5), each with longitudinal magnetization (51), provides a biasing magnetic field in the sensor stack (6) to orient the magnetization (81) of the free layer (8) in a longitudinal (cross-track) direction by means of a magnetostatic interaction.

In the most modern disk drives, the height at which the head flies above the rotating disk is already less than 5 nm, so the freedom of further flying height reduction to increase spatial resolution is reaching its limit. Thus, the common practice to increase the resolution is by reducing the reader-shield-spacing (RSS) (3) (also denoted RG width), so the magnetic spatial resolution increases correspondingly.

To reduce RSS, the thickness of the hard bias (HB) layers (5) will need to decrease as well. However, reducing the thickness of these magnetic HB layers will also reduce the amount of magnetic "charge" at the edges of the HB layers immediately adjacent to the sensor stack and facing the edges of the free layer. The fewer the magnetic charges, the less is the pinning field of the HB layers and the less effective they are at orienting the free layer magnetization. This, in turn, allows more thermal noise as a result of domain perturbations and a poorer SNR. Finally, reducing the overall thickness of the sensor stack (6) requires reducing the thickness of the horizontal layers that form it, particularly the thick AFM layer (13) that provides pinning for the three-layer structure (10), (11) and (12). Poorer pinning, in turn, will ultimately also adversely affect SNR. Thus, improving resolution by reducing the RG thickness of the sensor is not practical. It is therefore an object of the present invention to achieve the desired improvement in linear downtrack resolution by a method other than the reduction in RG width.

It is to be noted that the prior art discloses methods directed at improving sensor resolution. Examples of such prior art include Carey et al. (US Patent Appl. 2005/0207073) and U.S. Pat. No. 7,580,229, who disclose a hard magnet and exchange biasing for improved resolution; Covington (U.S. Pat. No. 6,809,900) who discloses a SAF free layer with hard magnets; Sakai et al. (U.S. Pat. No. 7,283,377) who discloses an abutted junction exchange biased structure; Sun et al. (US Patent Appl. 2008/0113220) who disclose free and fixed SAF layers and Mao et al. (U.S. Pat. No. 7,016,160), who disclose a plurality of tri-layer readers comprising SAF free layers. However none of these prior art methods describe the present invention.

SUMMARY OF THE INVENTION

A first object of this invention is to provide a MR read head design with improved down-track linear resolution without the necessity of a narrower read gap.

A second object of the present invention is to provide such a read head design by the use of a synthetic-antiferromagnetic (SAF) free layer (FL) structure, for achieving a high linear resolution without the use of read shields to shunt away interference from adjacent data bits during the read-back process.

A third object of this invention is to use exchange bias together with hard magnetostatic bias on the SAF FL structure to resolve an intrinsic instability issue of a prior art SAF FL design.

These objects will be met by a CPP MR read head design, a first embodiment of which is schematically illustrated in FIG. 2(A) and FIG. 2(B), which, analogously to FIGS. 1(A) and 1(B), show the read head and biasing layers in an ABS cross-sectional view (FIG. 2(A)) and an isolated view of the MR (more specifically, TMR) read head stack alone (FIG. 2(B)). The design of FIGS. 2(A) and 2(B) will be understood to be the first embodiment (Embodiment 1) of the invention and will be discussed further below. Additional embodiments, two through sixteen, (Embodiment 2-Embodiment 16) will also be described below.

Referring first to the patterned stack (66) of FIG. 2(B), and comparing the structure therein to the prior art stack structure (6) of FIG. 1(B), it can be seen that the single magnetic free layer ((8) of FIG. 1(B)) has been replaced, in the present invention, by a SAF free tri-layer structure, layers (22), (23) and (21), reading vertically downward. Layers (22) and (21) are ferromagnetic layers, typically formed of a NiFe compound or the like and intermediate layer (23) is a non-magnetic coupling layer that couples magnetic layers (22) and (21) in an antiferromagnetic configuration with oppositely directed magnetizations (arrows (221), (211)). It is preferred that layers (22) and (21) have similar magnetic moments, thicknesses and compositions, so that the strength of their AFM coupling with layer (23) is similar. In particular, the products of the magnetic moments and thicknesses of the two layers should, preferably, differ by no more than 30% of the greater value. The oppositely directed magnetizations of layers (22) and (21) is maintained during the rotations of the magnetizations of both layers under the action of the magnetic fields of recorded media.

Referring now to FIG. 2(A), there is shown the complete structure formed around the patterned MR stack (66) of FIG. 2(B). Compared to FIG. 1(A), in FIG. 2(A), a top magnetic exchange biasing structure, layers (28), (27), (26) and (25) (reading vertically downward), has replaced the top shield (1) of FIG. 1(A). Layers (27), (26) and (25) form another type of SAF structure, denoted a top exchange biasing SAF structure, having strongly pinned oppositely directed magnetizations (arrows (271) and (251)), which is pinned by the top layer (28), which is an antiferromagnetic (AFM) layer, such as a layer of IrMn. Strong pinning is required so that the SAF structure does not respond to external magnetic fields. We shall see in other embodiments that the top exchange biasing structure can also employ just a single biasing ferromagnetic layer. We note also that HB layers (5) are formed adjacent to the patterned sides of sensor stack (66). These HB layers can be CoPt or other materials of high coercivity and sufficient magnetic moment density, approximately 20-40 nm thick, approximately 1-2 microns wide (in the cross-track direction) and approximately 20-40 nm deep in a direction perpendicular to the ABS.

The top exchange biasing trilayered SAF structure (layers (27), (26) and (25)) has a different function than the pinned SAF structure comprising layers (10), (11), (12) and pinned by AFM (13), which, like layer (28), is also a layer of antiferromagnetic material, preferably IrMn, within the patterned stack (66) of FIG. 2(A). Here, layer (10) provides a fixed reference direction for rotations of the free layer. The top exchange biasing tri-layered SAF structure is used to longitudinally bias the magnetization (arrow (221)) of top layer (22) of the SAF free layer (i.e. layers (22), (23) and (21)), in stack (66). Layer (25) of the tri-layer top biasing SAF structure, couples antiferromagnetically to layer (22) of the SAF free layer structure by exchange coupling to layer (22) through coupling layer (24). This coupling layer (24) can be a layer of Ru of thickness approximately 0.8 nm or a modified composition Ru layer, of thickness to achieve the desired coupling strength of between approximately −0.3 to −0.1 erg/cm$^2$.

Finally, layer (9) is a non-magnetic junction layer that creates the GMR or TMR junction of [free layer/junction layer/pinned layer] sensor structure. If the junction layer (9) is a thin dielectric layer, it acts to allow electron tunneling according to a tunneling probability resulting from the relative magnetization directions of the free and pinned layers (the TMR effect). If the junction layer is a non-magnetic electrically conducting layer, it acts to provide a current according to a variable resistance that is produced by the relative magnetization directions of the free and pinned layers (the GMR effect).

It is to be noted that magnetic shields are still desirable above layer (28) (not shown) and below the stack, as represented by layer (2). In the present invention, such shielding is for shunting large external magnetic fields and not for enhancing reader resolution, as is done in the prior art (such as FIG. 1a).

The functions of the structure elements of the MR sensor shown in FIG. 2(A) and FIG. 2(B) are as follows.

(1) The MR signal from the MR sensor is generated by the junction formed of layer (21) of the SAF FL, junction layer (9) and reference layer (10) of the SAF pinned layer.

(2) The antiparallel magnetizations of layers (10) and (12) are pinned by the AFM layer (13) in directions perpendicular to the ABS (i.e., perpendicular to the plane of the figure). These magnetizations are shown as a dotted-circle (101) and a crossed-circle (121).

(3) Layer (10) is the reference layer for rotations of the magnetization (arrow (211)) of layer (21).

(4) Magnetizations (arrow (251) and (271)) of layers (25) and (27) are pinned longitudinally (in the directions shown) by the AFM layer (28).

(5) Layer (22) of the SAF free layer structure is AFM exchange biased by layer (25) of the SAF biasing structure with a magnetization directed as shown by arrow (221) with an effective exchange field strength denoted Hex.

(6) HB (hard bias) layer (5) provides a magnetostatically coupled bias field (arrow (51)) directed as shown by that arrow in both layers (21) and (22) of the SAF free layer structure. The HB field strength in (22) is X % of the exchange coupled bias field, Hex, provided by layer (25) to layer (22), where 0<x<100. The net effective bias field, Heff, in layer (22), as a percentage of Hex, is, therefore, Heff=(100−X)Hex, given that these fields are in opposite directions, and directed from right to left as shown by arrow (221). The net effective bias field in layer (21) is basically only the magnetostatically coupled HB field of layer (5), that is tuned to be Y % of Hex in layer (22), but directed from left to right as shown by arrow (211). Here we choose X and Y so that X+Y is in the range between 80 and 120, but preferably X+Y=100. Thus, the two magnetic layers (21) and (22) of the SAF free layer are biased almost symmetrically, with fields of the same strength, but oppositely directed.

Note that depending upon the positioning of the HB layers relative to the layers (21) and (22), the HB field in these layers can be different from each other. In the configuration of FIG. 2(A), the fields differ by little more than 5%. However, in embodiments nine through sixteen to be described below, variations in the HB field can be tuned by changing the thickness of the layer and its position relative to layer (21).

For example, a particularly good sensor performance was found when the top surface of layer (5) was aligned with the top surface of layer (21), while still allowing a smaller, (approximately 20%) HB field at the center of layer (22). In simulations with (a) X+Y greater than or equal to 100, meaning the bias field on layer (21) is slightly stronger than that on (22) in the opposite direction and (b) with X<Y, meaning that the field from the HB layer on (21) is stronger than that on (22), we can obtain better down-track performance. In case (b), we can make HB layer (5) thinner, so that X<Y.

Referring now to FIG. 3, there is shown a schematic isolated illustration of layers (22), (23) and (21) of FIG. 2(B), depicting an embodiment of the biasing scheme described above, where X+Y=100. Two magnetization arrows, Hex (solid arrow labeled "Hex"), directed to the left, and a dashed arrow representing the HB (hard bias) field (dashed arrow directed to the right labeled Hhb$_{22}$), where the magnitude of Hhb$_{22}$=XHex as a percentage (X %) of Hex. The leftward directed Hex results from the antiferromagnetic coupling to the rightward directed magnetization (251) in layer (25). Thus, the effective bias field, Heff, on layer (22) (represented by the large, 2-dimensional dashed arrow labeled Heff (directed to the left)) is of magnitude: Heff=(100−X)Hex.

Referring now to layer (21), there is shown the hard bias field on that layer (large dashed arrow labeled Hhb$_{21}$ directed to the right). That field is tuned to be YHex, as a percentage of Hex. Since X+Y=100, we have the effective bias field on layer (22) is: Heff=(100−X) Hex=YHex, in percentage terms.

The biasing scheme described above, with X+Y=100, produces a symmetric magnetic response in the two magnetic layers in the SAF free layer. This results in the best down-track resolution and signal stability, which is an object of the invention.

Referring back to FIGS. 2(A) and 2(B), the orthogonal pinning directions provided by antiferromagnetic (AFM) layers (13) and (28), which are orthogonal to the ABS plane and longitudinally directed within the plane, respectively, can be achieved with two annealing steps. First, the bottom AFM (13) pinning direction is set during the MR film level annealing (the film being the deposited layers comprising (66)) before forming both the HB layers (5) and the top exchange biasing structure of layers (25) to (28). Specifically, the bottom AFM layer (13) is annealed and its magnetization direction is set during a first annealing process prior to the deposition of the top AFM layer (28) and its anneal in a second annealing process. Both AFM layers are typically formed of IrMn. In all cases it is noted that subsequent annealing processes will not disturb this first annealing result.

The first anneal is at a higher temperature than the second, i.e., it is between approximately 250 and 300° C., in the presence of a magnetic field (typically >5 kOe), which is much larger than the AFM (13) saturation field (and for a time between approximately 1 and 5 hours). Layers (24) through (28) are deposited after the entire stack (66) is processed (i.e., patterned by etching). The HB layers may be deposited before or after layers (24)-(28), depending upon the particular embodiment configuration. Then, layer (28) is annealed in a second annealing process to set its magnetization and to pin layers (25) and (27) in their corresponding directions. The anneal of layer (28) is at a lower temperature than the first anneal, of between approximately 200 and 240° C., and in a lower field of between approximately 0.6 kOe and 1 kOe, so that this later anneal does not alter the magnetization direction of layer (13). This MR film level annealing is done under a long anneal time and higher anneal magnetic field perpendicular to the ABS to set the pinning layer magnetization. Note that the annealing process of the hard bias (HB) layers (5), that will be referred to as a third anneal, should not be at a temperature that exceeds that of the second anneal of the AFM layer (28). With this constraint, the third anneal temperature is also lower than that for AFM layer (13).

It is important for all embodiments discussed below that the anneals of the HB layers (5) and the AFM layer (28) do not disturb the first anneal of layer (13). If the hard bias layers are annealed after the second anneal of AFM layer (28), it is also important that the second anneal not flip the magnetization direction of the HB layers. Clearly, if the magnetization directions of AFM layer (28) and HB layers' (5) are the same, then this flip will not be a problem. The anneal field for the third anneal can be chosen to be the same as for the second anneal.

Referring now to FIG. 4, there is shown, schematically, the function of the SAF free layer during the read-back operation on recorded magnetic bits from a magnetic medium (31) moving from left to right, as indicated by arrow (311), relative to the sensor stack (66). Three exemplary magnetic patterns (schematically indicated by three vertical arrows) and five exemplary positions, (a), (b), (c), (d) and (e) of the stack relative to the medium, are used for explanation. At each of those positions there is shown a box indicating the magnetization directions of the layers (22) and (21) as they would appear if viewed along their actual longitudinal directions (into the plane of the figure). A cross-section in a vertical plane perpendicular to the ABS of the sensor stack (66) is shown above the magnetic medium. The longitudinal magnetizations of free layers (21) and (22) are now shown as arrows (211) and (221) perpendicular to the figure plane.

Due to the strong exchange coupling between the two magnetic layers (21) and (22) and their same or similar magnetic moments and thicknesses, at a mid point of a long magnetic pattern where both layers will experience essentially identical field strengths from that pattern, the rotation of their magnetizations will be essentially zero. Such zero rotations are shown at positions (a), (c) and (e) of five exemplary locations of the stack. The reason that the sensor is insensitive to a DC type of magnetic field produced when the sensor moves past a uniform bit pattern is that the magnetic energy increase in one layer of the SAF free layer is always completely offset by an energy decrease in the other layer when the layers are strongly exchange coupled.

However, when the sensor is located above a transition point between adjacent (and different) magnetic patterns, as at (b) and (d), the two layers of the SAF free layer experience opposite fields, so the changes in their respective energies is additive. Thus, the two layers rotate simultaneously by the same angular amount but in opposite vertical directions. Because layer (21) rotates relative to pinned layer (10) of the stack, the rotation produces a resistance change in the sensor and a corresponding voltage change across the sensor can be generated as a signal.

Curve (32) of FIG. 4 is an example of a signal output curve produced as the magnetic medium moves past the sensor and the corresponding regions of the patterns create the magnetization rotations. The signal peaks occur at positions (b) (positive peak) and (d) (negative peak), where the rotations occur.

Referring to FIG. 5, there are shown simulated read-back signal waveforms corresponding to pattern transition distances (i.e., bit lengths) of 300 nm (51), 30 nm (52) and 15 nm (53) as read by and produced by the structure of FIG. 2(A). The result shows that the peak-to-peak amplitude of the 30 nm bit length waveform is close to that of the 300 nm bit length waveform and the 15 nm bit length amplitude is approximately 54% of the 30 nm case, indicating good down-track resolution as required by the objects of the invention.

Differential sensors with two free layers for read-back of a perpendicular magnetic medium have been described in the prior art by S. Mao et al. (U.S. Pat. No. 7,016,160 B2). Similar configurations have been described in the context of MTJ sensor used in MRAM arrays by J. Sun et al. (US Publ. Pat. Appl. No. 2008/113220 A1). However, using a SAF free layer for a differential sensor with a single MR junction and using top exchange biasing in combination with longitudinal HB to achieve symmetric bias on both magnetic layers of the SAF free layer structure in the manner of the present invention has not been done. In fact, a direct utilization of a SAF free layer as by J. Sun, above, without the present biasing scheme, would lead to an unacceptably noisy and unstable read-sensor that would not be usable in hard disk drives.

BRIEF DESCRIPTION OF THE DRAWINGS

FIG. 1(A) is a schematic representation of a prior-art MR read head having upper and lower shields, longitudinal hard bias layers and a single layer free layer, as viewed from the ABS.

FIG. 1(B) is an isolated schematic view of the MR stack of FIG. 1(A).

FIG. 2(A) is a schematic representation of the MR read head of a first preferred embodiment of the present invention, having an upper SAF exchange bias layer in place of an upper shield, longitudinal hard bias layers used together with the exchange bias layers and a SAF free layer that is biased by a combination of the exchange biasing and hard biasing, viewed from the ABS.

FIG. 2(B) is an isolated schematic view of the MR stack in the first embodiment of the read head as described in FIG. 2a.

FIG. 3 is an illustration of the biasing fields impressed upon the SAF free layer of the MR read head of FIG. 2(A).

DESCRIPTION OF THE PREFERRED EMBODIMENTS

Figure 4:
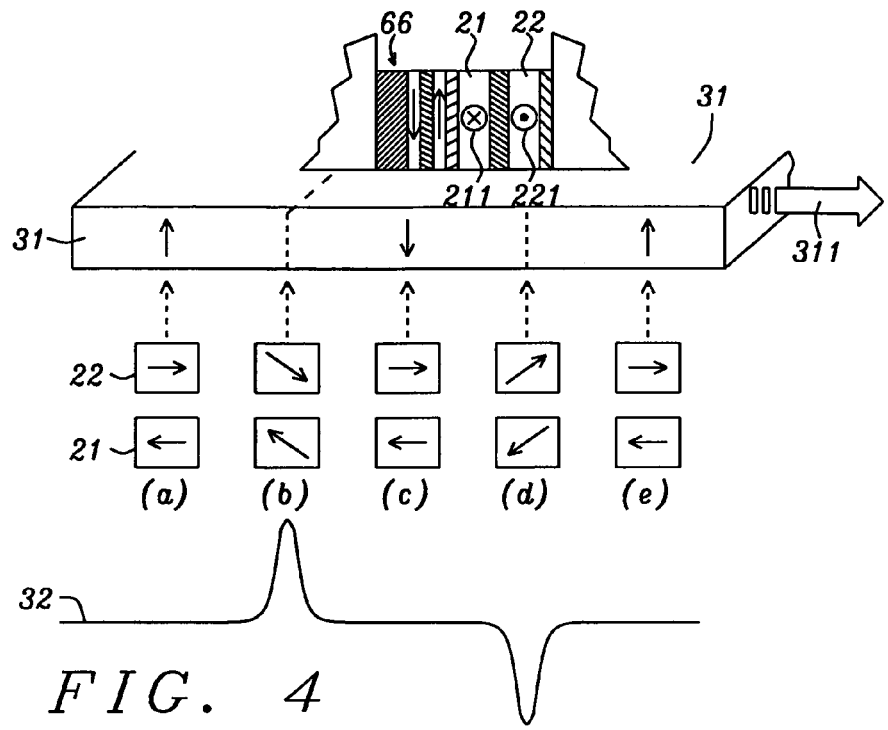
FIG. 4 is a schematic illustration showing the effects of recorded bit patterns on the magnetization rotations of the SAF free layer of FIG. 2(A) and the corresponding waveform generated by the read head.
Figure 5:
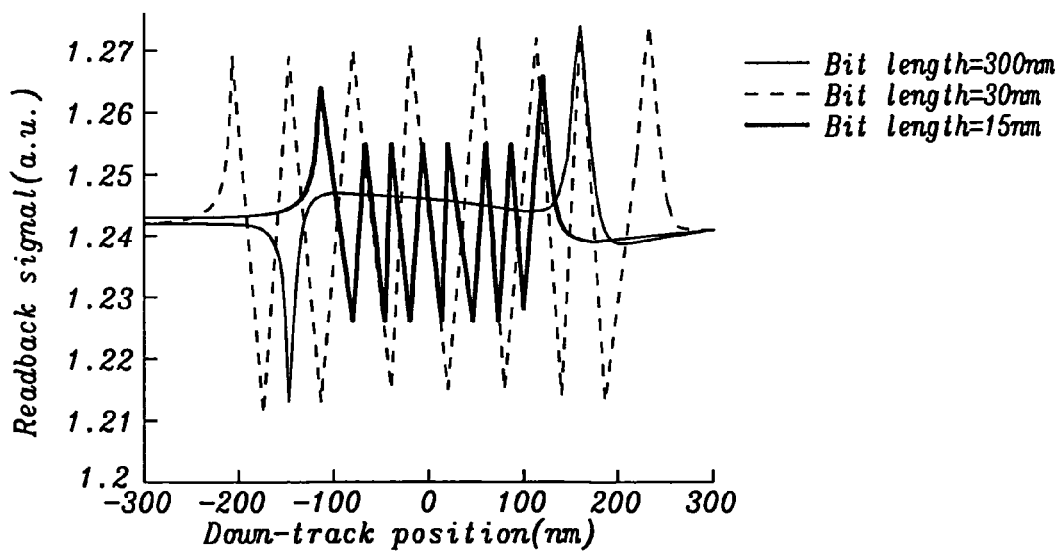
FIG. 5 is a schematic illustration showing simulated read back waveforms generated by the read head of FIG. 2(A) when reading bit length patterns of 15 nm, 30 nm and 300 nm.

Each of the preferred embodiments of this invention is a magneto-resistive (MR) read head incorporating an MR sensor stack (which could be a TMR or GMR configuration) having a synthetic antiferromagnetic (SAF) free layer (FL) that is longitudinally biased by the combined effects of a top exchange biasing structure and laterally disposed hard biasing (HB) layers. The top exchange biasing structure may be a single layer or it may itself be a pinned SAF tri-layer comprising a pair of oppositely magnetized ferromagnetic layers sandwiching a non-magnetic coupling layer. Further, the exchange biasing structure may be patterned along with the sensor stack, or it may be formed after the sensor stack is patterned. The exchange biasing structure is exchange coupled across a non-magnetic coupling layer to an upper layer of the SAF free layer to provide the biasing. Hard biasing (HB) layers are provided with two possible thicknesses and two corresponding positions adjacent to the free layer structure, according to the specific embodiments discussed below. Thicker hard biasing layers (Embodiments 1-8) are formed adjacent to the lateral ends of both magnetic layers of the SAF free layer. Thinner hard biasing layers (Embodiments 9-16) are formed adjacent to essentially only one (the lower) of the two magnetic layers in the SAF free layer, with the top surface of the hard biasing layer aligned with the non-magnetic coupling layer between the two magnetic layers.

Embodiment 1

The first embodiment of the present invention has already been described above with reference to FIG. 2(A) and FIG. 2(B). Remaining embodiments 2 through 16 are described below with reference to FIG. 6 through FIG. 20 respectively. It is understood that the discussion of the effects of the top exchange biasing structure and the side hard biasing layers will apply equally well to the remaining embodiments described below. It is also understood that the processes by which each of the embodiments are formed are substantially identical, specifically with respect to the sequence of anneals in which AFM pinning (13) and pinned layers in the stack are annealed first at a high temperature and field and the top AFM pinning layer (28) of the top biasing structure is annealed last at a lower temperature and smaller field so as not to affect the first annealing results of layer (13). The HB layer is provided with its own anneal, substantially similar to the weaker field anneal of the top biasing structure so as not to impact the initial anneal of the stack itself. Various patterning steps will be performed in accord with the desired structural shape of the embodiment and will be discussed with further specificity in each description below. We now reiterate the above discussion for clarity.

Referring back to FIGS. 2(A) and 2(B), the orthogonal pinning directions provided by layers (13) and (28) (orthogonal to the ABS plane and longitudinally directed, respectively) will be achieved with a sequence of annealing steps, whereby the AFM layer (13) pinning direction (and SAF pinned directions) is set during a first anneal, which is the MR film level annealing, in which the deposited layers comprising (66) are annealed before patterning. Then the annealed film is then patterned, the HB layers (5) are formed against the sides of the patterned stack (66) and the HB layers are annealed in a separate anneal, which will be similar to the final anneal described below. Then the top exchange biasing structure of layers (24) to (28) is deposited over the fabrication. Then a final anneal takes place, in which top AFM (28), is annealed producing the exchange coupling with the free layer structure. It is to be noted that the annealing process of the top exchange biasing structure still leaves the free layer with enough mobility to track the bit transitions in the magnetic media.

More specifically, the bottom AFM layer (13) is annealed first (after deposition of layers (13)-(22)) and its magnetization direction (perpendicular to the ABS plane) is set prior to the successive steps of stack patterning of layers (13)-(22), HB layer (5) deposition and third annealing and the deposition of the layers (24)-(28) followed by their anneal. The first anneal of AFM pinning layer (13) and the SAF pinned layer structure pinned by (13) is at a higher temperature than the second anneal of (28), namely between approximately 250 and 300° C., with a field much larger than the AFM layer saturation field (typically >5 kOe).

The HB layers may be deposited and annealed after deposition of layers (22)-(13) and their patterning. Finally, layers (24)-(28) are deposited after layers (5) have been deposited and layer (28) is annealed to set its magnetization and to pin layers (25) and (27) in their corresponding directions. The anneal of layer (28) is at a lower temperature than the first anneal of layer (13) of between approximately 200 and 240° C. and in a lower field of between approximately 0.6 and 1 kOe, so that this later second anneal does not alter the already set magnetization direction of layer (13). It is noted, that in all embodiments each of the various anneals require a time of between approximately 1 to 5 hours.

Embodiment 2

Figure 6:
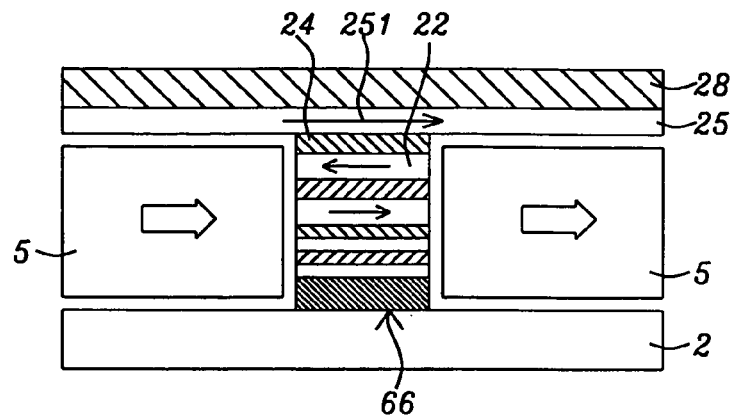
FIG. 6 is a schematic illustration showing a second embodiment of the present invention.

Referring now to FIG. 6, there is shown schematically a second embodiment of the present invention which is in all other aspects the same as the first embodiment illustrated schematically in FIG. 2(A) and FIG. 2(B) and described above, except that the top biasing structure, (28) and (25), that provides the exchange bias by exchange coupling to the free layer element (22) across coupling layer (24), includes only a single magnetic layer, layer (25), that is itself exchange coupled to an AFM pinning layer (28). The pinning direction of layer (28) on layer (25), is from left to right as shown by arrow (251). The formation of this embodiment, in annealing steps and patterning steps, is in all respects the same as described for embodiment 1 with the sole exception being the deposition of single layer (25) rather than the tri-layer of (25), (26) and (27) in the first embodiment.

Embodiment 3

Figure 7:
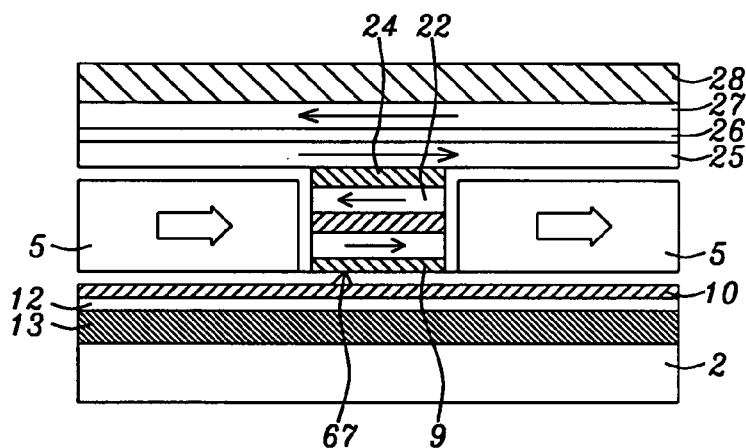
FIG. 7 is a schematic illustration showing a third embodiment of the present invention.

Referring now to FIG. 7, there is shown schematically a third embodiment of the present invention that is similar in all other aspects to the first embodiment, except that the MR stack, indicated as (67) (unlike stack (66) in FIG. 6) is not patterned horizontally (reduced in its width by etching) all the way down to AFM pinning layer (13) as in FIG. 2(A). Thus, the MR stack (67) of this embodiment has a uniformly narrow width encompassing the vertically stacked horizontal layers (24), (22), (23), (21) and (9), but is not horizontally patterned through layers (10), (11), (12) and (13), which retain a wider width. Subsequent to patterning, the hard biasing layers (5) are formed over the laterally extending unpatterned layers (10), (11), (12) and (13), with necessary isolation and seed layers (not indicated) between (5) and (10). Thus, the biasing layers (5) are now highly symmetrically placed relative to the SAF free layer structure and can provide similar fields to the two magnetic layers (21) and (22).

The complete formation of the structure comprises a deposition of layers (13)-(22) followed by a first high temperature, high field anneal of deposited layer (13). This anneal is then followed by a patterning of layers (22)-(13) and a deposition and anneal of HB layers (5). Then layers (24), (25), (26), (27) and (28) are formed and the final anneal is done to fix the biasing of layer (28) and the exchange coupling of layer (25) to layer (22). Temperatures and fields are as given above with reference to FIG. 2(A).

Embodiment 4

Figure 8:
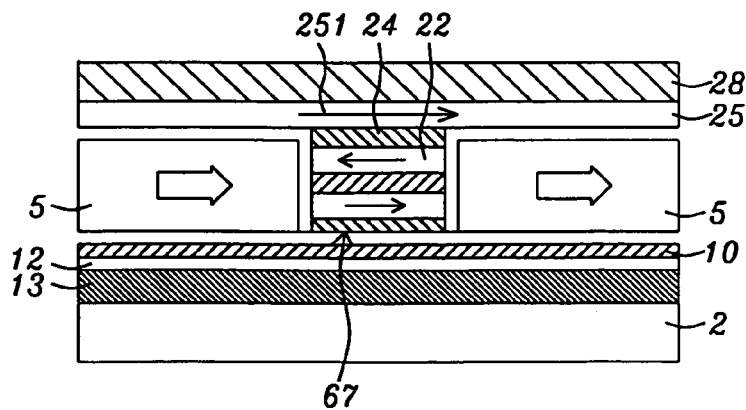
FIG. 8 is a schematic illustration showing a fourth embodiment of the present invention.

Referring now to FIG. 8, there is shown schematically a fourth embodiment of the present invention which is in all other aspects the same as the third embodiment illustrated schematically in FIG. 7 and described above, except that the top biasing structure, that provides the exchange bias to the free layer element (22), includes only a single magnetic layer, layer (25), that is exchange coupled to an AFM pinning layer (28). The pinning direction of layer (28) on layer (25) is from left to right as shown by arrow (251). The method of formation of this embodiment is the same as described with reference to embodiment 4, except that only a single biasing layer (25) is deposited over the stack (67) and HB layers (5).

Embodiment 5

Figure 9:
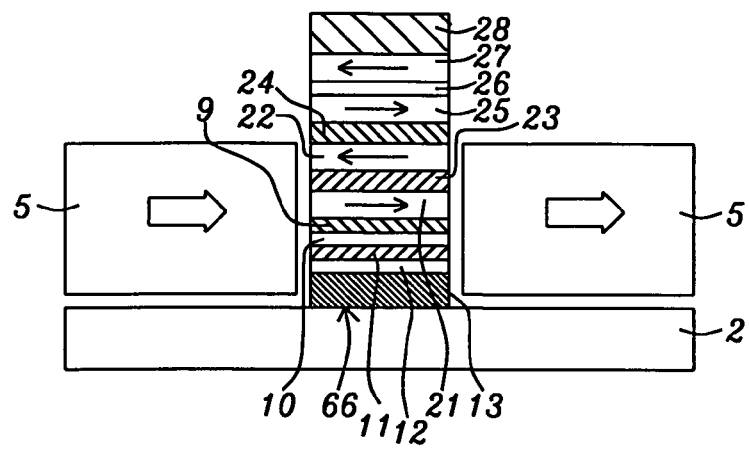
FIG. 9 is a schematic illustration showing a fifth embodiment of the present invention.

Referring now to FIG. 9, there is shown schematically a fifth embodiment of the present invention which is in all other aspects the same as the first embodiment except that the top SAF exchange bias structure, layers (28), (27), (26) and (25), are deposited together with the layers of the MR stack (stack (66) of FIG. 2(B)) and subsequently patterned together with that stack so that all layers: (28), (27), (26), and (25), together with layers (24), (22), (23), (21), (9), (10), (11), (12) and (13), have a common width. HB layers (5) are then deposited to the sides of the patterned formation.

The annealing sequence is as follows. Layers (22), (23), (21), (9), (10), (11), (12) and (13) are deposited and annealed in a first high temperature and high field anneal to set the magnetization of pinning layer (13). Then layers (24), (25), (26), (27) and (28) are deposited and second anneal at lower field and temperature occurs to anneal layer (28). Finally, the entire formation is patterned and, subsequent to that patterning, the HB layers (5) are formed and annealed in a third anneal that is substantially the same as the second anneal. As already noted, the time for each annealing process is between approximately 1 and 5 hours.

Embodiment 6

Figure 10:
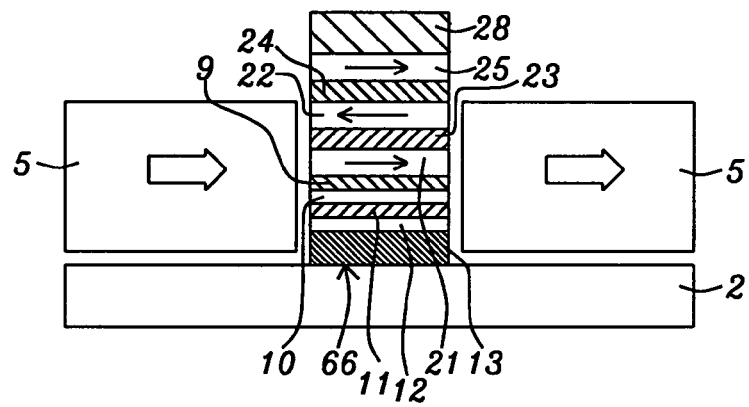
FIG. 10 is a schematic illustration showing a sixth embodiment of the present invention.

Referring now to FIG. 10, there is shown schematically a sixth embodiment of the present invention which is in all other aspects the same as the fifth embodiment (FIG. 9) except that the top exchange bias structure, layers (28), and (25) only includes a single ferromagnetic biasing layer (25), instead of the three layers (25), (26) and (27) of FIG. 9. The fabrication process is in all respects the same as used to form the fifth embodiment, except that only the single layer (25) is present instead of a tri-layer.

Embodiment 7

Figure 11:
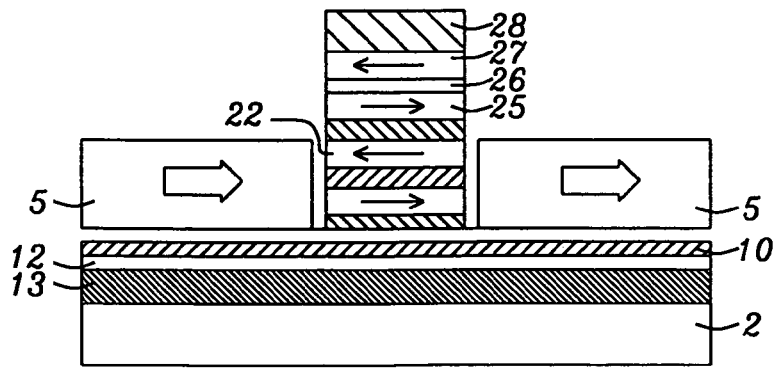
FIG. 11 is a schematic illustration showing a seventh embodiment of the present invention.

Referring now to FIG. 11, there is shown schematically a seventh embodiment of the present invention which is in all other aspects the same as the third embodiment illustrated schematically in FIG. 7, except that the entire top SAF biasing structure that provides the exchange bias to the free layer element (22), and includes pinning layer (28) and coupled magnetic layers (27) and (25), is deposited together with the MR stack (66) and subsequently is patterned with that stack so that layers (28), (27), (26), and (25), together with layers (24), (22), (23), (21) and (9) all have a common width.

The fabrication process proceeds as in the fifth embodiment, except that after the anneal of layer (13), the subsequent deposition of layers (24) through (28) and the anneal of layer (28), the subsequent patterning will only extend vertically to layer (10), which will not be reduced in width, as will neither layers (11), (12) and (13).

Embodiment 8

Figure 12:
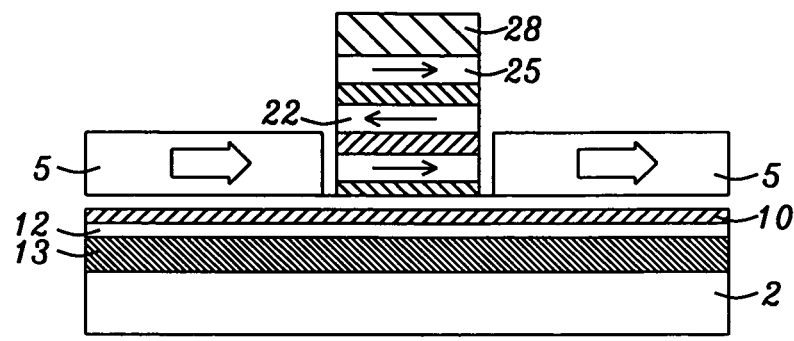
FIG. 12 is a schematic illustration showing an eighth embodiment of the present invention.

Referring now to FIG. 12, there is shown schematically an eighth embodiment of the present invention which is in all other aspects the same as the seventh embodiment illustrated schematically in FIG. 11, except that the top biasing structure, that provides the exchange bias to the free layer element (22) now includes only the single magnetic layer, layer (25), that is exchange coupled to an AFM pinning layer (28). Biasing layers (28), (25) and (24) are deposited together with the MR stack and both the stack and the biasing layers are subsequently patterned so that layers (28), (25), (24), (22), (23), (21) and (9) have a common width. Then HB layers (5) are deposited.

The fabrication process, including the annealing sequence and the patterning, is the same as in the seventh embodiment, except that the top bias layer is the single layer (25).

Embodiment 9

Figure 13:
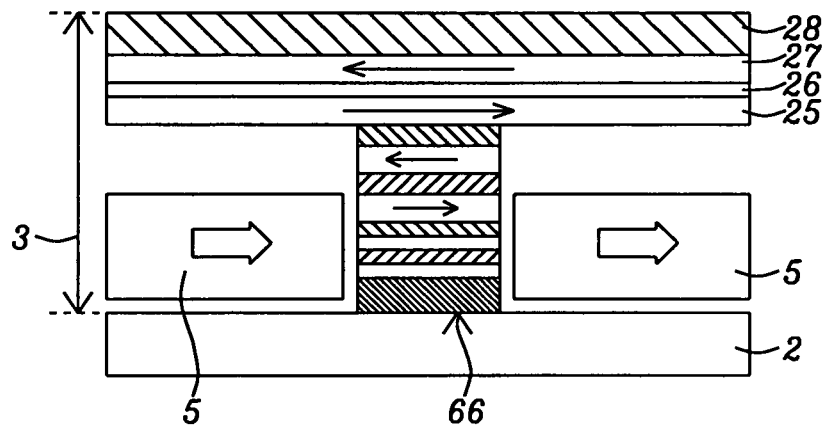
FIG. 13 is a schematic illustration showing a ninth embodiment of the present invention.

Referring to FIG. 13, there is shown a configuration of a ninth embodiment of the present invention. This embodiment is in all respects similar to the first embodiment illustrated in FIG. 2(A) and FIG. 2(B), except that the HB layers (5) are formed thinner than in FIG. 2(A) and the top horizontal surfaces of the HB layers are aligned at a lower vertical position between layers (21) and (22). As a result of the lowered position of thinner layer (5), it is now located adjacent to the lateral edges of layer (21) rather than being adjacent to both layers (21) and (22). Therefore, the strength of the hard bias magnetostatic field within (21) and (22) is different. This will generally result in difference performance characteristics of these embodiments with respect to downtrack resolution and should be considered when designing such structures.

Embodiments 9 through 12 will differ from their counterparts, embodiments 1 through 4 respectively, only by the thinner HB layer and its asymmetric location relative to layers (21) and (22) of the free layer structure. In embodiments 9 through 12, layer (5) is opposite to layer (21), with its upper surface being aligned horizontally between layers (22) and (21). As noted above, this difference in HB field strength within layers (21) and (22), as compared with the substantially similar HB field strengths in those same layers in embodiments 1 through 8, can lead to difference performance characteristics between the embodiments.

We repeat the basic fabrication steps of embodiments 9-12 as follows. The bottom AFM (13) is annealed first and its magnetization direction is set prior to the steps of stack patterning, HB layer deposition and the deposition of the top AFM layer (28). Then layer (28) is subjected to a second anneal to set its magnetization. The first anneal is at a higher temperature than the second anneal, namely between approximately 250 and 300° C., with a field much larger than the AFM saturation field (typically >5 kOe). Layer (28) is deposited after the entire stack (66) is processed (annealed and patterned). The HB layers may be deposited before or after layers (25)-(28), depending upon the patterning of (25)-(28) in each particular embodiment configuration. Finally, layer (28) is annealed to set its magnetization and to pin layers (25) and (27) in their corresponding directions. The anneal of layer (28) is at a lower temperature of between approximately 200 and 240° C. and in a lower field of between approximately 0.6 and 1 kOe, so that this later anneal does not alter the magnetization direction of layer (13).

Embodiment 10

Figure 14:
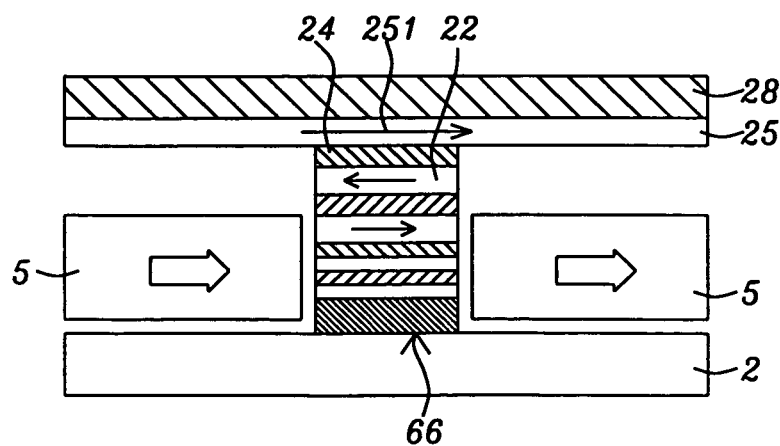
FIG. 14 is a schematic illustration showing a tenth embodiment of the present invention.

Referring now to FIG. 14, there is shown schematically a tenth embodiment of the present invention which is in all other aspects the same as the ninth embodiment illustrated schematically in FIG. 13, except that the top biasing structure, that provides the exchange bias by exchange coupling to the free layer element (22), includes only a single magnetic layer, layer (25), that is itself exchange coupled to an AFM pinning layer (28).

The method of fabricating this embodiment is the same as that employed in the ninth embodiment with the exception of the replacement of the tri-layered top exchange biasing structure with the single layer (25). The sequence of anneals, depositions and patterning are otherwise the same.

Embodiment 11

Figure 15:
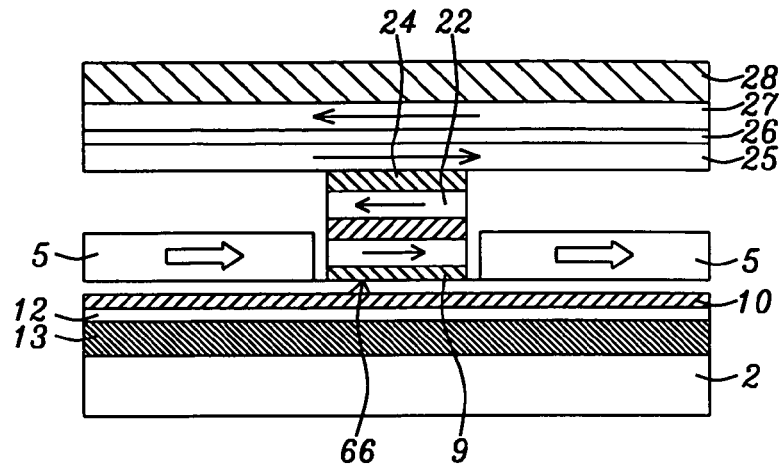
FIG. 15 is a schematic illustration showing an eleventh embodiment of the present invention.

Referring now to FIG. 15, there is shown schematically an eleventh embodiment of the present invention that is similar in all other aspects to the ninth embodiment, except that the MR stack (66) is not patterned horizontally (reduced in its width) all the way down to AFM pinning layer (13) as in FIG. 13. Thus, the MR stack of this embodiment has a uniformly narrow width encompassing the vertically stacked horizontal layers (24), (22), (23), (21) and (9), but is not horizontally patterned through layers (10), (11), (12) and (13), which retain a wider width. Subsequent to patterning, the thin hard biasing layers (5) are formed over the laterally extending unpatterned layers (10), (11), (12) and (13), with necessary isolation and seed layers (not indicated) between (5) and (10). Thus, the biasing layers (5) are now unsymmetrically placed relative to the SAF free layer structure and the upper surface of the layers is aligned between layers (21) and (22) and, therefore, layer (5) provides a stronger field to layer (21) than to layer (22).

The fabrication of this embodiment proceeds as in the third embodiment, which is the same as this embodiment with the exception of the thinner HB layers and their asymmetrical placement relative to the free layer structure.

Embodiment 12

Figure 16:
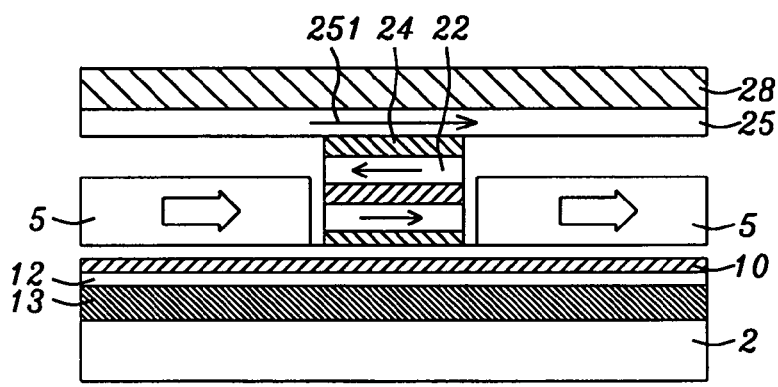
FIG. 16 is a schematic illustration showing a twelfth embodiment of the present invention.

Referring now to FIG. 16, there is shown schematically a twelfth embodiment of the present invention which is in all other aspects the same as the eleventh embodiment illustrated schematically in FIG. 15 and described above, except that the top biasing structure, that provides the exchange bias to the free layer element (22), includes only a single magnetic layer, layer (25), that is exchange coupled to an AFM pinning layer (28). The pinning direction of layer (28) on layer (25) is from left to right as shown by arrow (251). The fabrication process for this embodiment is, therefore, the same as that applied to the eleventh embodiment.

Embodiment 13

Figure 17:
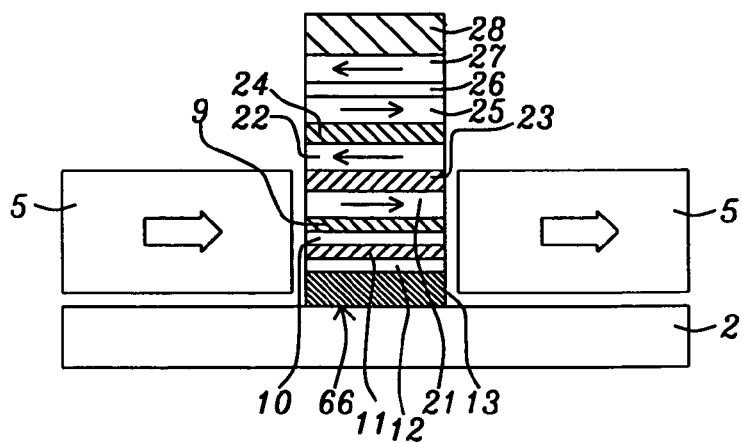
FIG. 17 is a schematic illustration showing a thirteenth embodiment of the present invention.

Embodiments 13 through 16 will be the same in all respects as embodiments 5 through 8, with the exception of the thinner hard bias layer (5) that is positioned alongside layer (21) rather than alongside both layers (21) and (22). Referring now to FIG. 17, there is shown schematically a thirteenth embodiment of the present invention which is in all other aspects the same as the fifth embodiment (FIG. 9), except that HB layers (5) are thinner and asymmetrically positioned against the free layer structure as discussed in the ninth embodiment. In this embodiment the top SAF exchange bias structure, layers (28), (27), (26) and (25), are deposited together with the MR stack (stack (66) of FIG. 2b) and subsequently patterned together with that stack so that all layers: (28), (27), (26), and (25), together with layers (24), (22), (23), (21), (9), (10), (11), (12) and (13), have a common width. The succession of processes employed in fabricating this thirteenth embodiment are exactly the same as those employed in fabricating the fifth embodiment, with the exception of the deposition of the thinner HB layers (5) and their asymmetric positioning. The sequence of first and second anneals and patterning are otherwise the same.

Embodiment 14

Figure 18:
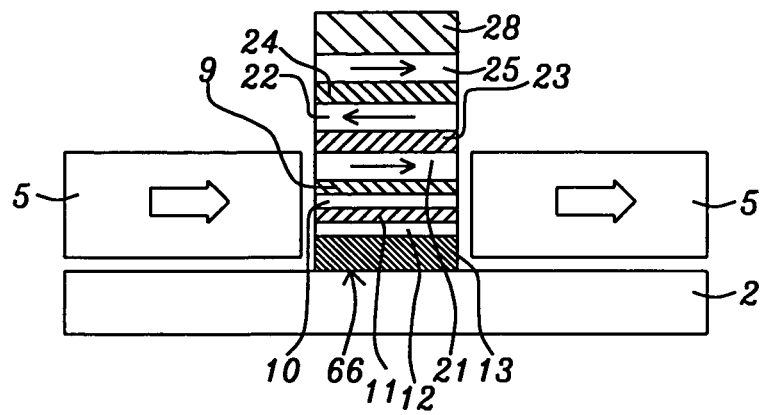
FIG. 18 is a schematic illustration showing a fourteenth embodiment of the present invention.

Referring now to FIG. 18, there is shown schematically a fourteenth embodiment of the present invention which is in all other aspects the same as the thirteenth embodiment except that the top exchange bias structure includes only AFM layer (28), and single layer (25) and not the tri-layered structure (25), (26) and (27). The fabrication process, including first and second anneals, and the deposition and patterning, are the same as in the thirteenth embodiment.

Embodiment 15

Figure 19:
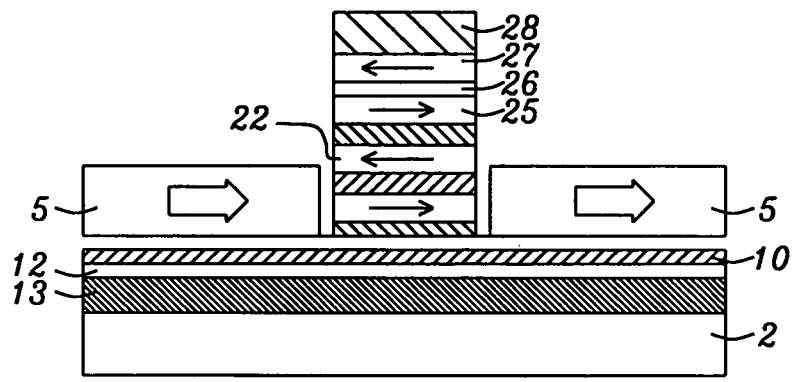
FIG. 19 is a schematic illustration showing a fifteenth embodiment of the present invention.

Referring now to FIG. 19, there is shown schematically a fifteenth embodiment of the present invention which is in all other aspects the same as the seventh embodiment illustrated schematically in FIG. 11, except that the HB layers (5) are thinner and asymmetrically positioned against the free layer structure so that (5) is adjacent to layer (21) and below layer (22). The fabrication process is the same as that employed in the seventh embodiment in terms of first and second anneals, layer depositions and patterning. Only the thinner HB layer and its asymmetric placement is different.

Embodiment 16

Figure 20:
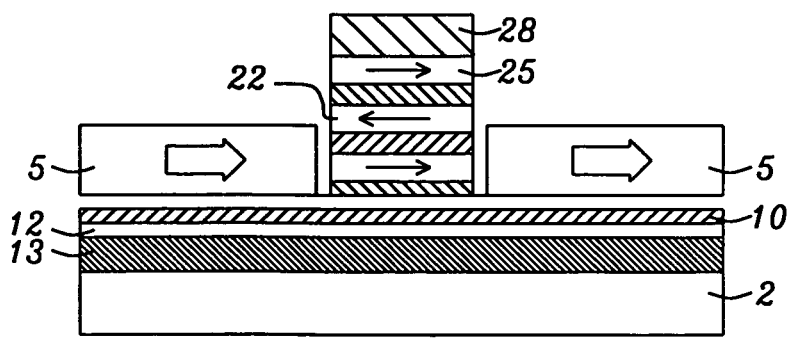
FIG. 20 is a schematic illustration showing a sixteenth embodiment of the present invention.

Referring now to FIG. 20, there is shown schematically a sixteenth embodiment of the present invention which is in all other aspects the same as the fifteenth embodiment illustrated schematically in FIG. 19, except that the top biasing structure, that provides the exchange bias to the free layer element (22) includes only the single magnetic layer (25), that is exchange coupled to an AFM pinning layer (28). The fabrication process is the same as employed in the fabrication of the fifteenth embodiment.

Note that additional shields may be formed above and below the present read sensor in each of the above described embodiments. However, such shields would be intended to shunt extraneous magnetic fields and avoid their undesirable effects, not to improve down-track resolution of the sensor as in the prior arts. In all previous embodiments, and in respective FIG. 6 through FIG. 20, such a lower shield has been indicated as layer (2), but no upper shield has been illustrated.

As is finally understood by a person skilled in the art, the preferred embodiments of the present invention are illustrative of the present invention rather than limiting of the present invention. Revisions and modifications may be made to methods, materials, structures and dimensions employed in forming and providing a MR read sensor in which a free layer is formed as a SAF structure and is biased longitudinally by both a SAF or single layer top exchange biasing structure and horizontally disposed hard bias layers, while still forming and providing such a device and its method of formation in accord with the spirit and scope of the present invention as defined by the appended claims.

What is claimed is:

1. An MR read sensor, comprising:
   a substrate;
   a patterned CPP MR stack formed on said substrate, wherein said CPP MR stack is a patterned vertical lamination of contiguous horizontal layers, wherein said CPP MR stack includes a synthetic antiferromagnetic (SAF) free layer structure and a first non-magnetic coupling layer formed on said free layer structure;
   a top exchange biasing magnetic layer structure formed over said first non-magnetic coupling layer, wherein said exchange biasing magnetic layer structure is magnetically exchange coupled to said SAF free layer structure and provides a longitudinal bias thereto; and
   a pair of hard bias (HB) layers, symmetrically disposed about lateral sides of said patterned CPP MR stack, wherein each of said HB layers is adjacent to a portion of said patterned side of said CPP MR stack and wherein said pair of HB layers provides a longitudinal bias to said SAF free layer structure.

2. The MR read sensor of claim 1 wherein said patterned CPP MR stack comprises:
   a pinning layer formed of an antiferromagnetic material formed on said substrate;
   an SAF pinned layer structure formed on said pinning layer and pinned thereby, wherein said SAF pinned layer structure comprises two ferromagnetic layers having parallel magnetizations that are oppositely directed and perpendicular to an ABS plane;
   a non-magnetic junction layer formed on said SAF pinned layer;
   said SAF free layer structure formed on said non-magnetic junction layer, wherein said SAF free layer further comprises a first ferromagnetic layer, a second non-magnetic coupling layer formed on said first ferromagnetic layer and a second ferromagnetic layer formed on said second non-magnetic coupling layer;
   the first non-magnetic coupling layer formed on said second ferromagnetic layer of said SAF free layer; and wherein
   said first and second ferromagnetic layers of said SAF free layer are magnetically biased in oppositely directed, parallel longitudinal directions.

3. The MR read sensor of claim 2 wherein said first ferromagnetic layer and said second ferromagnetic layer of said SAF free layer are close in their magnetic moments and thicknesses and wherein the product of magnetic moment and layer thickness for said first ferromagnetic moment differs from the product of magnetic moment and layer thickness for said second ferromagnetic layer by no more than 30% of that product for said first ferromagnetic layer.

4. The MR read sensor of claim 2 wherein said top exchange biasing structure magnetically exchange couples to said second ferromagnetic layer of said SAF free layer across said first non-magnetic coupling layer to produce an exchange biasing field of magnitude Hex and wherein said hard bias layers are placed symmetrically adjacent to lateral edges of both said first and second ferromagnetic layers of said SAF free layer and couple magnetostatically with substantially similar strengths to said first and second ferromagnetic layers of said SAF free layer, wherein said coupling is tuned to produce hard biasing fields of magnitudes Y % and X % of Hex respectively, whereby, by choosing X+Y=100, oppositely directed effective longitudinal biasing fields of equal magnitude, (Y %)Hex, are produced in said first and second ferromagnetic layers.

5. The MR read sensor of claim 2 wherein said top exchange biasing structure magnetically exchange couples to said second ferromagnetic layer of said SAF free layer across said first non-magnetic coupling layer to produce an exchange biasing field of magnitude Hex and wherein said hard bias layers are placed adjacent to lateral edges of said first ferromagnetic layer of said SAF free layer, but below lateral edges of said second ferromagnetic layer of said SAF free layer, whereby said hard bias layers couple magnetostatically with different strengths to said first and second ferromagnetic layers of said SAF free layer, wherein said coupling is tuned to produce hard biasing fields of magnitudes Y % Hex in said first ferromagnetic layer and X % Hex in said second ferromagnetic layer and wherein Y>X by as much as 20% and wherein Y+X is greater than or equal to 100.

6. The MR read sensor of claim 1 wherein said first non-magnetic coupling layer is a layer of Ru or Ru composition formed to a thickness of approximately 0.8 nm.

7. The MR read sensor of claim 1 wherein said first non-magnetic coupling layer is a layer of Ru or Ru composition formed to a thickness that provides a coupling strength between approximately −0.3 and −0.1 erg/cm$^2$.

8. The MR read sensor of claim 1 wherein said hard bias layers are formed of the high coercivity magnetic material CoPt to a thickness between approximately 20 and 40 nm.

9. The MR read sensor of claim 1 wherein said top exchange biasing magnetic layer structure comprises:
a first ferromagnetic layer formed on said first non-magnetic coupling layer;
a third non-magnetic coupling layer formed on said first ferromagnetic layer;
a second ferromagnetic layer formed on said third non-magnetic coupling layer;
an antiferromagnetic pinning layer formed on said second ferromagnetic layer;
and wherein said first and second ferromagnetic layers are magnetized in opposite longitudinal directions to form an SAF structure and are magnetically pinned by said pinning layer.

10. The MR read sensor of claim 9 wherein said CPP MR stack and said top exchange biasing structure are patterned to have a common uniform width that includes all layers of said stack and said top exchange biasing structure.

11. The MR read sensor of claim 9 wherein said top exchange biasing structure and said CPP MR stack are patterned to have a portion of uniform narrow width, wherein said portion extends vertically downward to include said top exchange biasing structure, said first non-magnetic coupling layer, said SAF free layer structure and said non-magnetic junction layer and wherein said SAF pinned layer structure and said pinning layer are not included in said narrow width portion and extend laterally and symmetrically beyond the width of said narrow portion.

12. The MR read sensor of claim 9 wherein said CPP MR stack is patterned to have a common uniform width that includes all layers of said stack and said top exchange biasing structure extends laterally and symmetrically beyond the width of said CPP MR stack.

13. The MR read sensor of claim 9 wherein said CPP MR stack is patterned to have a portion of uniform narrow width, wherein said portion extends vertically downward to include said first non-magnetic coupling layer, said SAF free layer structure and said non-magnetic junction layer and wherein said SAF pinned layer structure and said pinning layer and said top exchange biasing structure are not included in said narrow width portion and extend laterally and symmetrically beyond the width of said narrow portion.

14. The MR read sensor of claim 1 wherein said top exchange biasing magnetic layer structure comprises:
a ferromagnetic layer formed on said first non-magnetic coupling layer;
an antiferromagnetic pinning layer formed on said second ferromagnetic layer;
wherein a magnetization of said ferromagnetic layer is magnetically pinned by said pinning layer in a longitudinal direction.

15. The MR read sensor of claim 14 wherein said CPP MR stack and said top exchange biasing structure are patterned to have a common uniform width that includes all layers of said stack and said top exchange biasing structure.

16. The MR read sensor of claim 14 wherein said top exchange biasing structure and said CPP MR stack are patterned to have a portion of uniform narrow width, wherein said portion extends vertically downward to include said top exchange biasing structure, said first non-magnetic coupling layer, said SAF free layer structure and said non-magnetic junction layer and wherein said SAF pinned layer structure and said pinning layer are not included in said narrow width portion and extend laterally and symmetrically beyond the width of said narrow portion.

17. The MR read sensor of claim 14 wherein said CPP MR stack is patterned to have a common uniform width that includes all layers of said stack and said top exchange biasing structure extends laterally and symmetrically beyond the width of said CPP MR stack.

18. The MR read sensor of claim 14 wherein said CPP MR stack is patterned to have a portion of uniform narrow width, wherein said portion extends vertically downward to include said first non-magnetic coupling layer, said SAF free layer structure and said non-magnetic junction layer and wherein said SAF pinned layer structure and said pinning layer and said top exchange biasing structure are not included in said narrow width portion and extend laterally and symmetrically beyond the width of said narrow portion.

19. A method of forming an MR read sensor, comprising:
providing a substrate;
forming a CPP MR stack on said substrate, wherein said CPP MR stack is a vertical lamination of contiguous horizontal layers and wherein said CPP MR stack includes a pinning layer formed of an antiferromagnetic material, a synthetic antiferromagnetic (SAF) pinned layer structure pinned by said pinning layer, an SAF free layer structure and a first non-magnetic coupling layer formed on said SAF free layer structure;
annealing said CPP MR stack at a first annealing temperature, in a first annealing magnetic field for a first annealing time to set a magnetization direction of said pinned layer SAF structure perpendicular to an ABS plane and to magnetize said pinned layer SAF structure in an antiferromagnetic configuration;

patterning said CPP MR stack;

forming hard bias layers symmetrically disposed to each lateral side of said patterned CPP MR stack;

annealing said hard bias layers in a third anneal;

forming a top exchange biasing structure over said CPP MR stack and said hard bias layers;

annealing said top exchange biasing structure in a longitudinal direction at a second annealing temperature, using a second annealing magnetic field and a second annealing time thereby magnetizing said SAF free layer structure in an antiferromagnetic configuration and exchange coupling said top exchange biasing structure to said SAF free layer structure.

20. The method of claim 19 wherein said CPP MR stack is a vertical lamination of horizontal layers comprising:

said pinning layer formed of an antiferromagnetic material;

said SAF pinned layer formed on said pinning layer and pinned thereby, wherein said SAF pinned layer comprises two ferromagnetic layers sandwiching a third non-magnetic coupling layer;

a non-magnetic junction layer formed on said pinned layer;

said SAF free layer formed on said non-magnetic junction layer, wherein said SAF free layer further comprises a first ferromagnetic layer, a second non-magnetic coupling layer formed on said first ferromagnetic layer and a second ferromagnetic layer formed on said second non-magnetic coupling layer;

said first non-magnetic coupling layer formed on said second ferromagnetic layer of said SAF free layer.

21. The method of claim 20 wherein patterning said CPP MR stack and said top exchange biasing structure comprises narrowing the width of said stack and said exchange biasing structure by uniformly narrowing the width of all of contiguous horizontal layers to create a stack of uniform width having sides that are vertical and planar.

22. The method of claim 20 wherein said hard bias layers are positioned adjacent to said SAF free layer, whereby magnetic fields of substantially equal magnitude are produced by said hard bias layers in said first ferromagnetic layer and said second ferromagnetic layer.

23. The method of claim 20 wherein said hard bias layers are positioned adjacent to said first ferromagnetic layer and, thereby, below said second ferromagnetic layer of said SAF free layer, whereby a magnetic field greater in magnitude by as much as 20% is produced by said hard bias layers in said first ferromagnetic layer as compared to said second ferromagnetic layer.

24. The method of claim 19 wherein forming said top exchange biasing magnetic layer structure comprises:

forming a first ferromagnetic layer over said CPP MR stack and said hard bias layers;

forming a second non-magnetic coupling layer on said first ferromagnetic layer;

forming a second ferromagnetic layer on said second non-magnetic coupling layer;

forming an antiferromagnetic pinning layer on said second ferromagnetic layer.

25. The method of claim 19 wherein forming said top exchange biasing magnetic layer structure comprises:

forming a first ferromagnetic layer over said CPP MR stack;

forming a second non-magnetic coupling layer on said first ferromagnetic layer;

forming a second ferromagnetic layer on said second non-magnetic coupling layer;

forming an antiferromagnetic pinning layer on said second ferromagnetic layer.

26. The method of claim 19 wherein patterning said CPP MR stack comprises uniformly narrowing the width of said stack by uniformly narrowing the width of all of said contiguous horizontal layers to create a stack of uniform width having sides that are vertical and planar.

27. The method of claim 19 wherein patterning said CPP MR stack comprises narrowing the width of a portion of said stack by uniformly narrowing the width of said first non-magnetic coupling layer, said SAF free layer structure and said junction layer, while leaving the width of said SAF pinned layer structure and said pinning layer wider and extending symmetrically laterally beyond the width of said narrowed portion of said stack.

28. The method of claim 19 wherein said first annealing temperature is between approximately 250 and 300° C., wherein said first annealing field is greater than 5 kOe, wherein said second annealing temperature is between approximately 200 and 240° C. and said second annealing field is between approximately 0.6 and 1 kOe and wherein said third anneal is substantially the same as said second anneal.

29. A method of forming an MR read sensor, comprising:

providing a substrate;

forming a CPP MR stack on said substrate, wherein said CPP MR stack is a vertical lamination of contiguous horizontal layers and wherein said CPP MR stack includes an antiferromagnetic pinning layer, a synthetic antiferromagnetic (SAF) pinned layer structure pinned by said pinning layer, a SAF free layer structure and a first non-magnetic coupling layer formed on said SAF free layer structure;

annealing said CPP MR stack at a first annealing temperature, in a first annealing magnetic field for a first annealing time to set a magnetization direction of said pinned layer structure perpendicular to an ABS plane and establish an antiferromagnetic magnetization configuration;

forming a top exchange biasing structure over said CPP MR stack;

annealing said top exchange biasing structure in a longitudinal direction using a second annealing temperature, in a second annealing magnetic field and for a second annealing time whereby said SAF free layer structure is magnetized in an antiferromagnetic configuration and is magnetically exchange coupled to said top exchange biasing structure;

patterning said CPP MR stack together with said top exchange biasing structure;

forming hard bias layers symmetrically disposed to each lateral side of said patterned CPP MR stack and annealing said hard bias layers in a third anneal.

30. The method of claim 29 wherein said CPP MR stack is a vertical lamination of horizontal layers comprising:

said pinning layer formed of an antiferromagnetic material;

said SAF pinned layer formed on said pinning layer and pinned thereby, wherein said SAF pinned layer comprises two ferromagnetic layers sandwiching a third non-magnetic coupling layer;

a non-magnetic junction layer formed on said pinned layer;

said SAF free layer formed on said non-magnetic junction layer, wherein said SAF free layer further comprises a first ferromagnetic layer, a second non-magnetic coupling layer formed on said first ferromagnetic layer and a second ferromagnetic layer formed on said second non-magnetic coupling layer;

said first non-magnetic coupling layer formed on said second ferromagnetic layer of said SAF free layer.

31. The method of claim 29 wherein patterning said CPP MR stack and said top exchange biasing structure comprises narrowing the width of said stack and said exchange biasing structure formed on said stack by uniformly narrowing the width of all layers to create a stack of uniform width having sides that are vertical and planar.

32. The method of claim 19 wherein said first annealing temperature is between approximately 250 and 300° C., wherein said first annealing field is greater than 5 kOe, wherein said second annealing temperature is between approximately 200 and 240° C. and said second annealing field is between approximately 0.6 and 1 kOe and wherein said third anneal is substantially the same as said second anneal.

* * * * *